(12) United States Patent
Vyvoda et al.

(10) Patent No.: US 6,486,065 B2
(45) Date of Patent: Nov. 26, 2002

(54) METHOD OF FORMING NONVOLATILE MEMORY DEVICE UTILIZING A HARD MASK

(75) Inventors: Michael A. Vyvoda, Fremont; N. Johan Knall, Sunnyvale; James M. Cleeves, Redwood City, all of CA (US)

(73) Assignee: Matrix Semiconductor, Inc., Santa Clara, CA (US)

(*) Notice: Subject to any disclaimer, the term of this patent is extended or adjusted under 35 U.S.C. 154(b) by 0 days.

(21) Appl. No.: 09/746,469

(22) Filed: Dec. 22, 2000

(65) Prior Publication Data

US 2002/0081851 A1 Jun. 27, 2002

(51) Int. Cl.$^7$ ............................................. H01L 21/461
(52) U.S. Cl. ....................... 438/690; 438/631; 438/626; 438/424
(58) Field of Search ............................ 438/424, 645, 438/553, 690; 365/51, 103

(56) References Cited

U.S. PATENT DOCUMENTS

| 4,099,196 A | 7/1978 | Simko |
| 4,119,995 A | 10/1978 | Simko |
| 4,489,478 A | 12/1984 | Sakuri |
| 4,500,905 A | 2/1985 | Shibata |
| 5,306,935 A | * 4/1994 | Esquivel et al. ............ 257/315 |
| 5,835,396 A | * 11/1998 | Zhang ............................ 365/51 |
| 6,034,882 A | * 3/2000 | Johnson et al. ............. 365/103 |
| 6,258,656 B1 | * 7/2001 | Lange et al. ................. 438/240 |
| 6,294,460 B1 | * 9/2001 | Subramanian et al. ...... 438/636 |

FOREIGN PATENT DOCUMENTS

| EP | 0073486 | 8/1982 |
| EP | 0395886 | 3/1990 |

OTHER PUBLICATIONS

Yoichi Akasak, "Three–Dimensional Integrated Circuit: Technology and Application Prospect"Microelectronics Journal, vol. 20, Nos. 1–2, 1989.
Yoichi Akasaka "Three–Dimensional IC Trends"Proceedings of the IEEE, vol. 74, No. 12, Dec. 1986.
"Exotic Memories Diverse Approaches"EDN Asia Magazine, Sep. 2001.

* cited by examiner

*Primary Examiner*—David Nelms
*Assistant Examiner*—Thao P. Le
(74) *Attorney, Agent, or Firm*—Blakely, Sokoloff, Taylor & Zafman LLP

(57) ABSTRACT

The present invention is a method of fabricating a semiconductor array. According to the present invention, a semiconductor layer having an upper surface is formed. A masking layer is then formed on the semiconductor layer. The masking layer is then patterned. The semiconductor layer is etched in alignment with the patterned masking layer to define memory array features. The gap between the features is filled with the dielectric material which is softer than the masking layer with respect to a planarization

24 Claims, 11 Drawing Sheets

METHOD OF FORMING NONVOLATILE MEMORY DEVICE UTILIZING A HARD MASK

BACKGROUND OF THE INVENTION

1. Field of the Invention

The invention relates to the field of vertically stacked field programmable non-volatile memories and more specifically to methods of fabricating memory arrays utilizing a hard mask.

2. Discussion of Related Art

Recently there has been an interest in fabricating memories having memory cells disposed at numerous levels above a substrate. Each level includes a plurality of spaced-apart first lines extending in one direction which are vertically separated from a plurality of parallel spaced-apart second lines extending perpendicular to the first line. Cells are disposed between the first lines and second lines at the intersections of these lines. These memories are described in U.S. Pat. Nos. 5,835,396 and 6,034,882. Unfortunately, during the fabrication of the lines during the planarization of a gap fill dielectric between the lines, the lines can become eroded which detrimentally effects the reliability and performance of the fabricated memory array.

SUMMARY OF THE INVENTION

The present invention is a method of fabricating a semiconductor array. According to the present invention, a semiconductor layer having an upper surface is formed. A masking layer is then formed on the semiconductor layer. The masking layer is then patterned. The semiconductor layer is etched in alignment with the patterned masking layer to define memory array features. The gap between the features is filled with the dielectric material which is softer than the masking layer with respect to a planarization step. The dielectric material is then planarized with the masking layer acting as a polish stop.

DETAILED DESCRIPTION OF THE PRESENT INVENTION

The present invention is a method of forming an array, preferably a three-dimensional memory device. In the following description numerous specific details are set forth such as specific materials and layer thicknesses. It will be apparent, however, to one skilled in the art that the present invention may be practiced without these specific details. In other instances, well-known circuits and fabrication techniques have not been set forth in detail in order not to unnecessarily obscure the present invention.

According to the present invention, a hard mask is used during the patterning of films used to form the memory (or other) array and used as a planarization stop during the planarization of the fill dielectric formed between the devices of the memory array. The use of a hard mask during memory array patterning and dielectric filling and planarization can be used in a wide variety of memory array configurations. In one embodiment, a hard mask is used during the formation of a memory array configured from orthogonally or perpendicularly running rail stacks. In another embodiment, a hard mask is used during the fabrication of a pillar memory array. The use of a hard mask helps prevent erosion of the top silicon or terminal films used in the fabrication process which enables the formation of uniform memory devices across a wafer, from level to level, and from wafer to wafer.

OVERVIEW OF THE STRUCTURE OF A RAIL STACK MEMORY ARRAY

Figure 1:
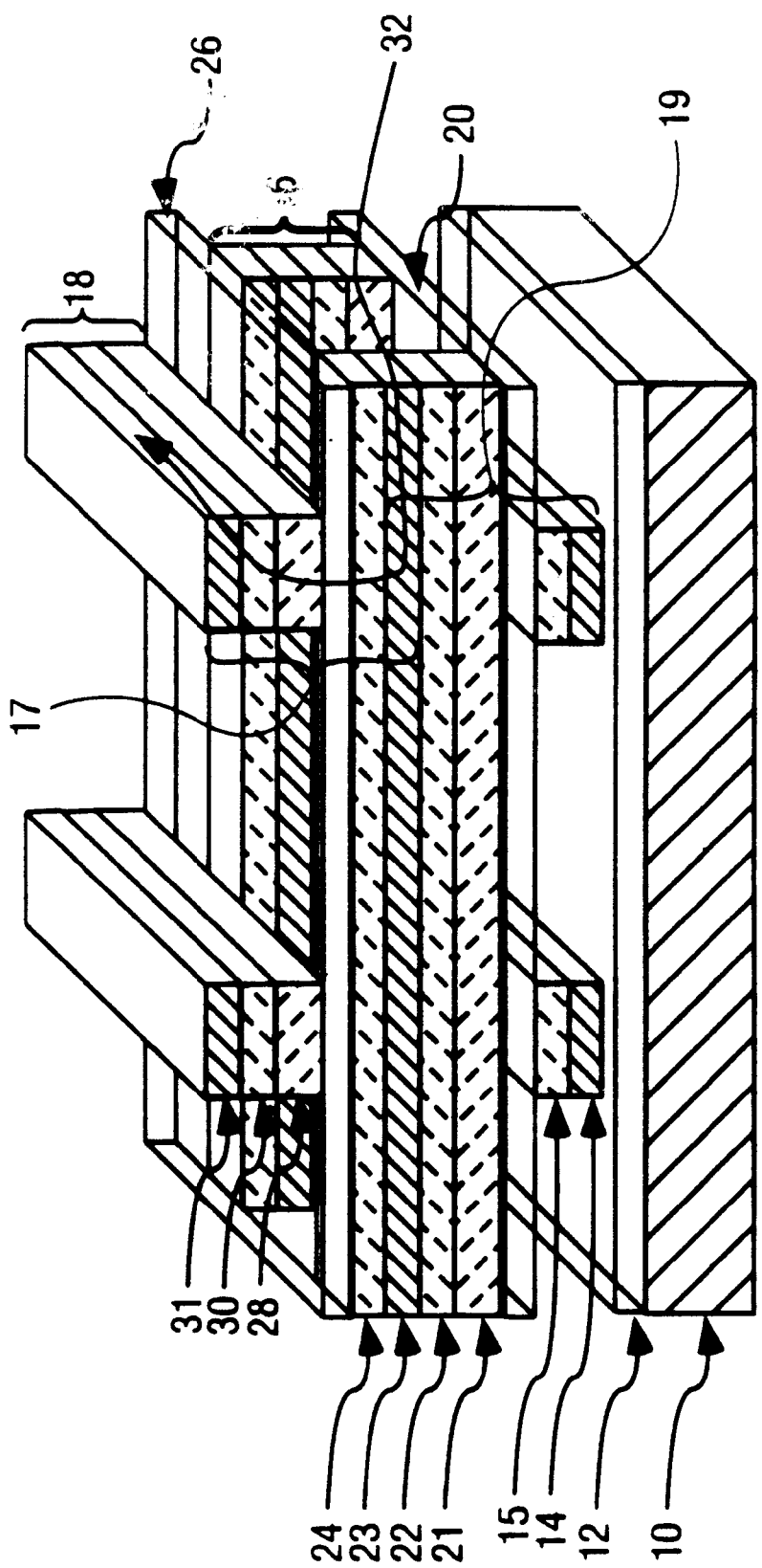
FIG. 1 is a perspective view of a cut-away portion of a memory array.

FIG. 1 illustrates a memory array fabricated from a plurality of rail stacks. The memory array is fabricated on several levels and, for instance, may have eight levels of storage. Each level includes a first plurality of parallel spaced-apart rail stacks running in a first direction and a second plurality of rail stacks or conductors (depending on the embodiment) running in a second direction. Generally, the first rail stacks run perpendicular to the second conductors/rail stacks and hence form a right angle at their intersections.

The use of rail stacks is a departure from prior art three-dimensional memories where conductors alone were used in lieu of rail stacks, and where discrete cells (e.g., pillars) were formed at the intersections of the lines. As will be seen, a bit is stored at each of the intersections of rail stacks. However, there is no apparent individual memory cell at the intersections, rather memory cells are defined by the rail stacks and intermediate layers. This makes it easier to fabricate the invented array as will be seen. When the array is fabricated all the bits are in the zero (or one) state and after programming, the programmed bits are in the one (or zero) state.

In the embodiment of FIG. 1 several rail stacks are illustrated in the partial cross-section of the invented array. For instance, rail stack 16 is shown at one height and a half rail stack 18 is shown at a second height above the first height. Also, half rail stacks are disposed between rail stack 16 and a substrate 10. These lower rail stacks run in the same direction as the half rail stack 18. A bit is stored at the intersection of rail stacks and, for instance, a "cell" is present between the rail stacks and layers shown within the bracket 17 and another within the bracket 19. Each of these brackets span a memory level.

The array is fabricated on a substrate 10 which may be an ordinary monocrystaline silicon substrate. Decoding circuitry, sensing circuits, and programming circuits are fabricated in one embodiment within the substrate 10 under the memory array using, for instance, ordinary MOS fabrication techniques. Vias are used to connect conductors within the rail stacks to the substrates to allow access to each rail stack in order to program data into the array and to read data from the array. For instance, the circuitry within the substrate 10 may select rail stack 16 and the rail stack 18 in order to either program or read a bit associated with the intersection of these rail stacks.

As shown in FIG. 1, an insulating layer 12 is formed over the substrate in order that the array may be fabricated above the substrate. This layer may be planarized with, for instance, chemical-mechanical polishing (CMP) to provide a flat surface upon which the array may be fabricated.

Following this, a conductive layer 14 is formed on the substrate. As will be seen, conductive layers are used within the rail stacks and these layers and the resultant conductors may be fabricated from elemental metals such as tungsten, tantalum, aluminum, or copper, or metal alloys may be used, such as MoW. Metal silicides may also be used such as $TiSi_2$, or $CoSi_2$, or a conductive compound such as TiN, or WC may be used. A highly doped semiconductor layer such as silicon is also suitable. Multiple layer structures may be used selecting one or more of the above.

Following the deposition of a conductive layer, a layer of semiconductor material (layer 15) such as silicon is formed over the conductive layer. This is typically a polysilicon layer; however, an amorphous layer may be used. Other semiconductor materials may be used such as Ge, GaAs, etc. In the embodiment of FIG. 1 this semiconductor layer is highly doped and, as will be seen, forms one-half a diode. After masking and etching steps, half rail stacks are formed. These rail stacks are "half" or partial rail stacks since they are approximately half the thickness of the rail stacks used in the next level.

Following a dielectric deposition and polish to form a dielectric fill, in the embodiment of FIG. 1, a material for the antifuses used to program the array is deposited. In one embodiment, the layer 20 is a dielectric such as silicon dioxide which is deposited by chemical vapor deposition (CVD) in a blanket deposition over the half rail stacks and a dielectric fill, filling the space between the rail stacks. In another embodiment the layer 20 is grown on the upper surface of the silicon layer 15 and only exists on the rail stacks.

Now a full set of memory array rail stacks is formed on the layer 20. This comprises first the deposition of a lightly doped silicon layer 21 doped with a conductivity type dopant opposite to that used for the silicon layer 15, a heavily doped silicon layer 22 doped also opposite to the layer 15, a conductive layer 23 and a heavily doped silicon layer 24 doped with the same conductivity type dopant as layers 21 and 22. After masking and etching, the rail stacks shown in FIG. 1, such as rail stack 16, are formed. These rail stacks are, as illustrated, in a direction perpendicular to the rail stacks above and below them.

While not shown in FIG. 1 but as will be described later, the spaces between the rail stacks after they are defined, are filled with a dielectric such as silicon dioxide. Then the rail stacks and fill are planarized by CMP. In another embodiment spin-on-glass (SOG) is used to fill the voids. In this case chemical planarization can be used, for example, plasma etching. Other fill and planarization methods can be used.

After formation of the rail stacks another antifuse layer 26 is formed, for instance, from a dielectric such as silicon dioxide, silicon nitride, silicon oxynitride, amorphous carbon or other insulating materials or combinations of materials. (Also an undoped layer of silicon may be used for the antifuse layer.)

Now another layer of rail stacks are defined and only half rail stacks are shown in FIG. 1 at this upper level. This half rail stack comprises a silicon layer 28 doped with a conductivity type dopant opposite to that of layer 24. This is a lightly doped layer. Another silicon layer 30 is formed on layer 28 and this layer is doped with the same conductivity type dopant as layer 28, however, it is more heavily doped. Then a conductive layer 31 is formed above the layer 30.

Half rail stacks are used at the very upper-most level of the array and at the very lowest level of the array. In between the half rail stacks the full rail stacks, such as rail stack 16, are used throughout the array. If desired, a full rail stack can be used for the upper most level of the array.

It should be noted that the silicon layers disposed on the conductive layers extend the entire length of the rail stacks in the embodiment of FIG. 1 and are uninterrupted except possibly where vias are used to provide a conductive path to the substrate 10.

In FIG. 1 a path 32 is illustrated from a lower conductor in level 17 to an upper conductor in this level found in the rail stack 18. This path is accessed in one embodiment through decoding circuitry in the substrate for both programming and reading of data into and from the array for one bit.

For instance, to program the bit, a relatively high voltage, 5–20V is applied between the conductors generally so as to forward-bias the "diode" between these conductors. This relatively high voltage causes a breach in the layer 26 creating a diode. Without this high voltage, the layer 26 remains an insulator. Thus, by selecting pairs of conductors, diodes can be selectively formed so as to program the array. While programming the array with the layers adjacent to the antifuse material being forward-biased is currently preferred, it is also possible to program using a reverse-biasing potential.

To sense the data programmed into the array, a voltage lower than that for programming is used. This voltage is applied so as to forward-bias the diode of the cell being accessed and thus allowing a sense amplifier to determine whether or not the layer 26 is intact between the rail stacks. Note that "sneak" or parasitic paths in the array which would interfere with the sensing will include a reverse-biased diode.

Also as will be described later, the "anode" and "cathode" of the diodes are reversed at each of the successive antifuse layers. This facilitates easier programing and sensing since all of its conductors at each level are either bit lines or word lines. And, for instance, conductors at one height will serve as bit lines for two levels and conductors at the next height serve as word lines for two levels. This simplifies the decoding and sensing and more importantly reduces processing.

Figure 2:
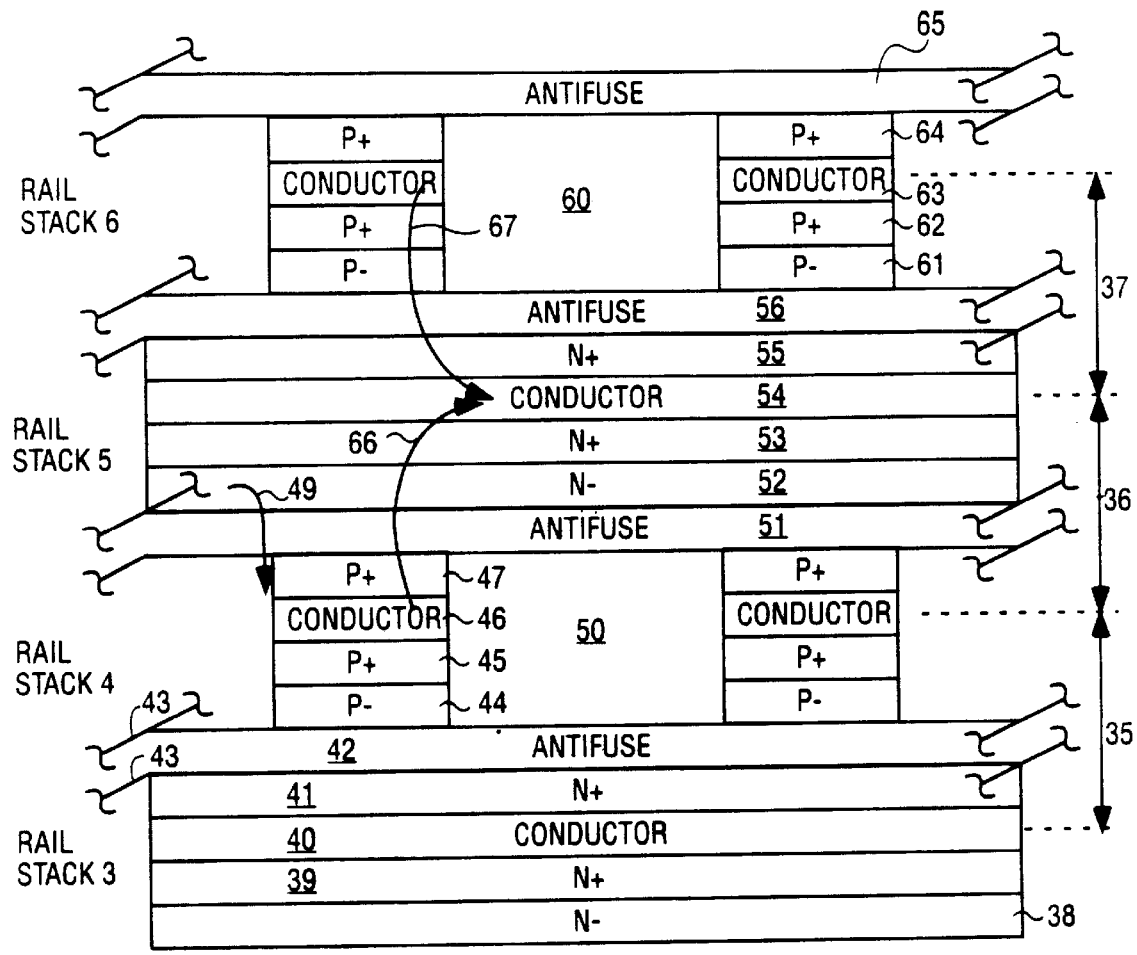
FIG. 2 is a cross-sectional elevation view of one embodiment of a memory array.

Embodiment of FIG. 2

In the cross-section elevation view of FIG. 2, one embodiment is illustrated which corresponds to the embodiment shown in FIG. 1. In FIG. 2 the half rail stacks of FIG. 1 are not illustrated. Three complete levels 35, 36 and 37 of the array are illustrated in FIG. 2. Below layer 38 of FIG. 2 other rail stacks or half rail stack are used. Also above layer 65, a full or half rail stack is used.

Figure 3:
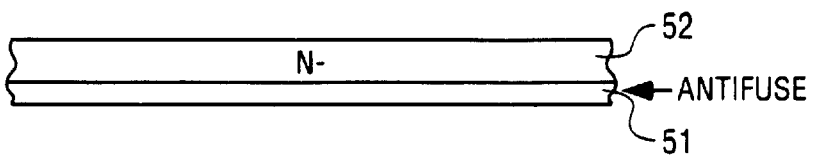
FIG. 3 is a cross-sectional elevation view of an antifuse and semiconductor layer formed during the fabrication of a memory array.

The rail stack 3 comprising layers 38 through 41 includes a lightly doped N− layer 38, a heavily doped N+ layer 39, a conductor layer 40 and N+ layer 41. The fabrication of these rail stacks will be discussed in more detail in conjunction with FIG. 3 through FIG. 13. An antifuse layer 42, which for the embodiment of FIG. 3 is a blanket deposition, covers all of the rail stacks formed below layer 42 as well as the fill filling the voids between the rails. As mentioned, the layer 42 can be a deposited silicon dioxide layer in one embodiment.

It should be noted that N+ layers sandwich the conductor layer 40. These highly doped layers provide ohmic transitions to prevent unintended Schottky diode formation.

The layers above and below conductor 40 are not symmetrical for the embodiment illustrated in that an N− layer 38 is used below the conductor 40 and not above the conductor 40. Only a single lightly doped layer (in conjunction with a heavily doped layer) is needed to define a diode; the thickness of this lightly doped layer is important in controlling the break-down voltage reverse leakage current and resistance of the diode so formed. The layer 41, a heavily doped semiconductor layer, and the fill are planarized after the rail stacks are defined and then a blanket deposition of the antifuse layer 42 is formed on the layer 41. (The lines 43 in FIG. 2 are used to indicate that the antifuse layer 42 and like layers are not etched with the rail stack below it and thus extend over the entire array for the illustrated embodiment.)

One advantage to the layer 42 and the other like layers in the structure, such as layers 51, 56 and 65, is that since they are an unbroken deposition, sidewall leakage (into the rail stacks below) will be minimized, limiting electrical problems during reading and writing. When subsequent conductive material is deposited, it is unable to reach the sides of the rail stacks below it because of this blanket deposition of the antifuse layer. For instance, path 49, which would allow silicon from layer 52 to cause a parasitic path, does not exist because of the unbroken blanket deposition of the antifuse layer 51.

Rail stacks 4 comprising layers 44, 45, 46 and 47 are formed on the antifuse layer 42. Layer 44 is lightly doped with a P− type dopant for the embodiment illustrated followed by a P+ layer 45, a conductive layer 46 and a P+ layer 47. After these layers are deposited, they are masked and etched to define the rail stacks. Then the voids between these rail stacks, such as void 50, are filled with a dielectric. The fill dielectric is planarized along with a portion of P+ layer 47. Planarization is done at this point in the fabrication since there is generally poor control over the thickness and contour of the fill. The fill tends to build up on the rail stacks when a non-spin-on glass deposition is used. This is followed by a blanket deposition of layer 51.

The process is now repeated, this time beginning with an N− layer 52 followed by an N+ layer 53, a conductive layer 54 and N+ layer 55. Again after defining the rail stacks 5, the voids are filled and the surface is planarized. Another antifuse layer 56 is deposited.

The process is repeated for the rail stacks 6 this time beginning with a P− layer 61, P+ layer 62, conductive layer 63, P+ layer 64. Again after defining the rail stacks, filling the void 60 and then planarizing, another antifuse layer 65 is deposited.

As shown by the path 66, when a large enough voltage is applied between conductors 46 and 54, the antifuse layer 51, at the intersection of layers 47 and 52, is breached or ruptured creating a diode at the intersection. As mentioned, this is selectively done throughout the array to program the array. The conductor 54 is therefore a bit line for the "cells" above and below it. For instance, path 67 indicates another possible current path for another "cell" where the conductor 54 is again a bit line during sensing.

Processing Flow for the Embodiment of FIG. 2

The process flow for forming rail stack 5 of FIG. 2 with a hard mask is illustrated in FIGS. 3–12. It will be apparent that the rail stacks for the other levels can be similarly processed.

First, as shown in FIG. 3 an antifuse layer 51 is deposited. This typically is 25–200 Å of silicon dioxide which can be deposited with any one of very well-known processes. Following this, a silicon layer 52 is deposited which is typically 1000–4000 Å thick and formed with a CVD process where a phosphorous dopant is deposited along with the deposition of for instance, the polysilicon semiconductor material or where the dopant is ion implanted following the deposition of the layer. This layer is doped to a level of $5 \times 10^{15} - 1 \times 10^{18}/cm^3$.

In this application "polysilicon" layers may be deposited as polysilicon or may be formed from an amorphous silicon layer. In one embodiment, an amorphous silicon layer is deposited and annealed in a rapid thermal anneal (RTA) step of 800° C. for 1 minute. This increases the crystal sizes and activates the dopant. The dopant can be ion implanted or introduced during the deposition of the amorphous silicon layer.

Figure 4:
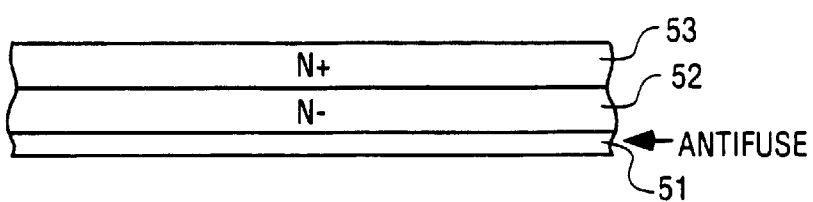
FIG. 4 illustrates the structure of FIG. 3 after an additional semiconductor layer has been formed.

Now, as shown in FIG. 4, an N+ layer 53 is deposited again using CVD. This layer may be approximately 300–3000 Å thick and in one embodiment is doped to a level of $>10^{19}/cm^3$.

Throughout this application two adjacent silicon layers are often shown such as layers 52 and 53, with different doping concentration. These layers may be formed in one deposition by changing the dopant concentration during an in situ deposition process. Alternatively, these layers may be formed with one deposition, and then using an ion implantation step at two different energy levels and dosages to obtain the two doping levels.

Figure 5:
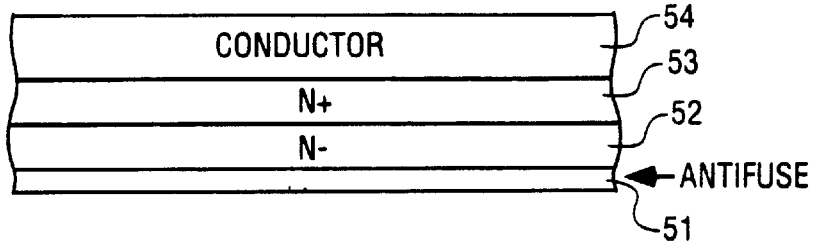
FIG. 5 illustrates the structure of FIG. 4 after a conductive layer is formed.

Next, as shown in FIG. 5, a conductive layer, which may be 500–1500 Å thick, is formed using any one of numerous well-known thin film deposition process such as sputtering. A refractory metal may be used or a silicide of a refractory metal. Also as mentioned aluminum or copper can be used, or more simply the heavily doped silicon can be the conductor.

Figure 6:
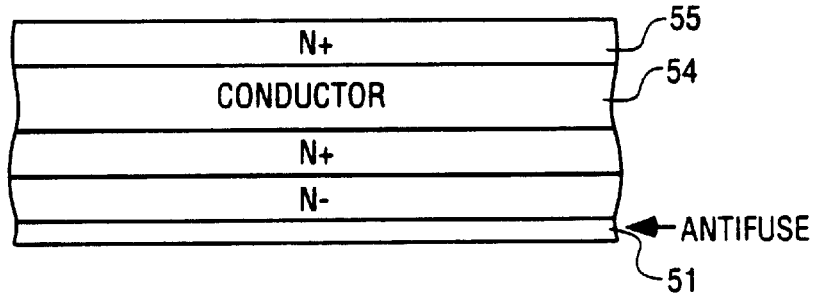
FIG. 6 illustrates the structure of FIG. 5 after an additional semiconductor layer has been formed.

Next, as shown in FIG. 6, another semiconductor layer of, for instance, polysilicon, is formed again doped to a level of $>10^{19}/cm^3$. This is shown as N+ silicon layer 55 in FIG. 6; silicon layer 55 can have a thickness between 300 Å and 2000 Å. Silicon layer 55 needs only to be deposited to the thickness desired for the memory cells, without the need for depositing additional "sacrificial" silicon, because a subsequently formed hard mask will protect the silicon layer 55 during subsequent polishing, etching, and cleaning steps which would otherwise erode the silicon thickness. Because no sacrificial silicon is needed, less furnace time is needed for the deposition of the terminal silicon film 55 than if sacrificial silicon was needed.

Figure 7:
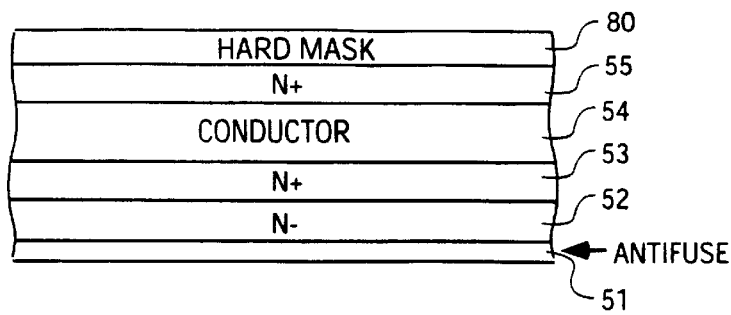
FIG. 7 illustrates the structure of FIG. 6 after the formation of an overlying hard masking layer.

After the formation of the N+ silicon film 55 as shown in FIG. 6, a hard mask layer 80 is formed on the silicon film 55 as shown in FIG. 7. The hard mask layer 80 may be formed from a material such as silicon nitride to a thickness of 1500 Å. A silicon nitride film can be formed by plasma enhanced chemical vapor deposition (PECVD). Another material that may be used is TiN. The hard mask layer 80 should be of a hard material, that is, a material that erodes more slowly than the dielectric filling material used in a subsequent step. That is, we will see that the hard mask layer 80, after patterning, acts as a polish stop for a planarization step. The masking layer 80 will preferably have a selectivity of greater than 4:1 with respect to the subsequently deposited fill dielectric during the subsequent polishing of the fill dielectric. This selectivity, however, can differ with choice of polishing consumables, such as slurries, as well as polishing parameters.

In this embodiment of the present invention, the hard masking layer will typically include a lower thin (25–200 Å) buffer oxide layer to protect the underlying silicon.

Figure 8:
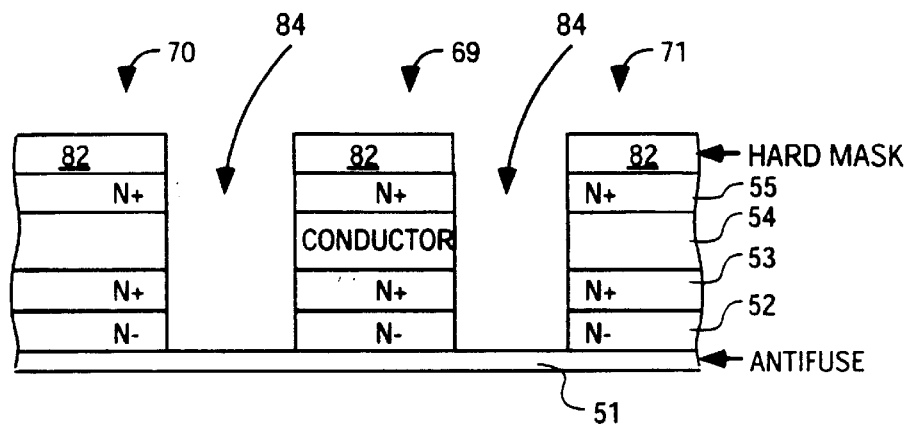
FIG. 8 illustrates the structure of FIG. 7 after the mask and silicon layers have been patterned.

After the hard mask layer 80 has been formed, it is patterned using ordinary photolithographic and etching steps to form a mask 82 as shown in FIG. 8. A silicon nitride film can be patterned utilizing a plasma etch comprising HBr, $CF_4$, and $O_2$. Mask 82 defines the locations where a plurality of spaced-apart lines or rail stacks are to be formed from the films 52, 53, 54, and 55. Additionally, as also shown in FIG. 8 the films for the rail stacks are etched in alignment with the mask 82 forming a plurality of spaced-apart rail stacks or lines 70, 69 and 71. Spaces 84 result between the lines as shown in FIG. 8. Silicon/conductor stacks can be etched with a plasma etch comprising some or all of the following gases: HBr, $Cl_2$ and $O_2$. The use of a hard mask 82 during etching of the silicon films, to form the plurality of rails, enables the rail stacks to be formed with better critical dimension (CD) control than if a hard mask 82 was not used. Additionally, because no sacrificial silicon is necessary for the terminal silicon film 55, less etch time is required to etch the rails 70, 69, and 71 than if sacrificial silicon was used.

Following the etching shown in FIG. 8, the spaces 84 between the lines 70, 69, and 71 are filled with a dielectric material 72, such as a high density plasma (HDP) chemical vapor deposited (CVD) silicon dioxide or other dielectric material. The dielectric material 72 is chosen to be softer than the masking layer 80, as mentioned with regards to planarization. An important example is the use of a chemical mechanical polishing (CMP) slurry that is selective to silicon dioxide over the silicon nitride. That is, the erosion rate of silicon dioxide is much greater than that of silicon nitride using such slurry.

Figure 9:
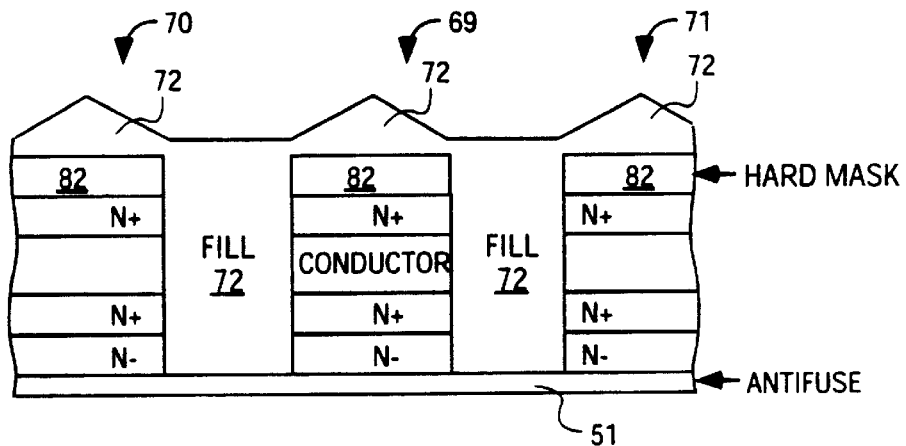
FIG. 9 illustrates the structure of FIG. 8 after a dielectric filling material is formed.

In one embodiment, the fill dielectric 72 as shown in FIG. 9 is deposited to a level sufficient to completely fill spaces or gaps 84. It is to be appreciated that during deposition fill 72 accumulates on the tops of the masking members 82 as a result of filling the dielectric material between the lines. In an alternative embodiment, the fill is deposited in a manner so that the spaces 84 are filled to a level below the upper surface (i.e., silicon film 55) of rails 69, 70, and 71. In an another embodiment, the dielectric is deposited in a manner to fill the spaces to a height within the hard mask 82. The height of the fill can be used to cause the silicon rails 70, 69, and 71 to be either recessed, planar with, or protruding from the fill dielectric 72 after hard mask removal. Well-known processing steps can be used to assure the desired height of the fill between the lines.

Figure 10:
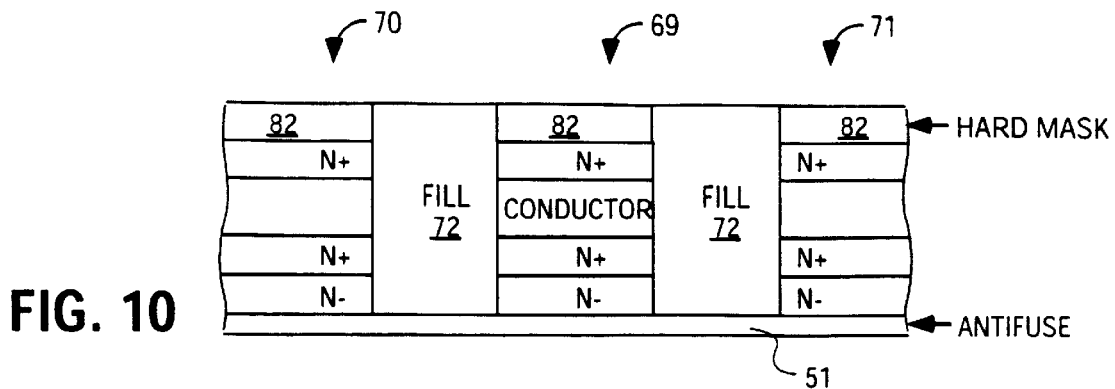
FIG. 10 illustrates the structure of FIG. 9 after a planarization step.

Next as shown in FIG. 10, planarization occurs which removes the dielectric material 72 from the upper surfaces of the hard mask 82. While chemical planarization may be used, in one embodiment chemical-mechanical polishing (CMP) is preferred. The etchants used in such planarization are selected from commercially available etchants such that the dielectric material is eroded without significant etching of the mask. In effect, the mask acts as an erosion stop for the resultant structure shown in FIG. 10. Note that the erosion does not significantly affect the fill level between the lines. In an embodiment of the present invention, the oxide dielectric fill 72 is chemically mechanically polished from a silicon nitride hard mask 82 utilizing a slurry that erodes the silicon dioxide dielectric at a much faster rate than the silicon nitride hard mask, such as a silica or ceria ($CeO_2$) slurry. In this way, hard mask 82 acts as a polish stop for the CMP process. The use of a hard mask 82, as a polish stop, allows over polishing to be used to ensure that all fill dielectric 72 is removed from the hard mask. This is especially important to ensure that wider features, such as landing pads and scribe line structures can be completely cleared of dielectric fill. In this way, subsequent photolithographic steps do not suffer from "depth of focus" issues caused by nonplanar topography from fill dielectric remaining on the large features. Without a hard mask, significant sacrificial silicon would be necessary to enable over polishing to sufficiently clear the large features and to allow for adequate CMP processing margin. After polishing a post CMP clean, typically an $NH_4OH$ based scrub, can be used to clean the structure.

Now hard mask 82 is removed using, for instance, an ordinary step which selectively removes the silicon nitride without disturbing the underlying silicon and the fill 72. A hot phosphoric acid strip can remove a silicon nitride mask. A HF dip can then be used to remove the thin buffer oxide, if used. A silicon nitride film can be removed with a plasma or wet etchant.

Figure 11:
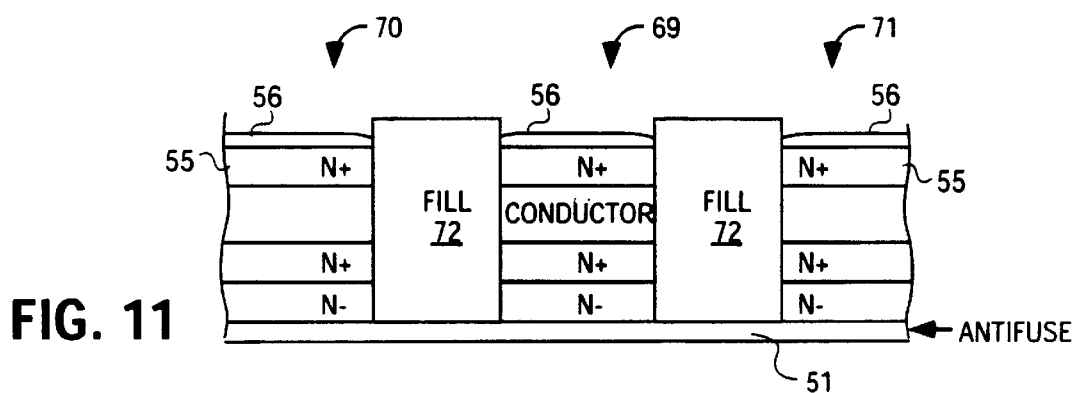
FIG. 11 illustrates the structure of FIG. 10 after the hard mask has been removed and an antifuse layer of a thermally grown oxide has been formed.

Next, an antifuse 56 is formed on silicon film 55 of lines 70, 69, and 71 as shown in FIG. 11. In an embodiment, the antifuse is a grown oxide so that it forms only on the exposed upper surface of silicon film 55 of the lines 70, 69, and 71 as shown in FIG. 11. In one embodiment, this oxide is grown at a temperature of 600° C. in a steam atmosphere for one hour. This results in an antifuse layer 56 of silicon dioxide having a nominal thickness of 50 Å. In another embodiment, the antifuse is grown by a high density plasma process utilizing $O_2$. In still yet another embodiment, the antifuse is a deposited oxide and deposits not only on the silicon film 55, but also over fill dielectric 72.

Figure 12:
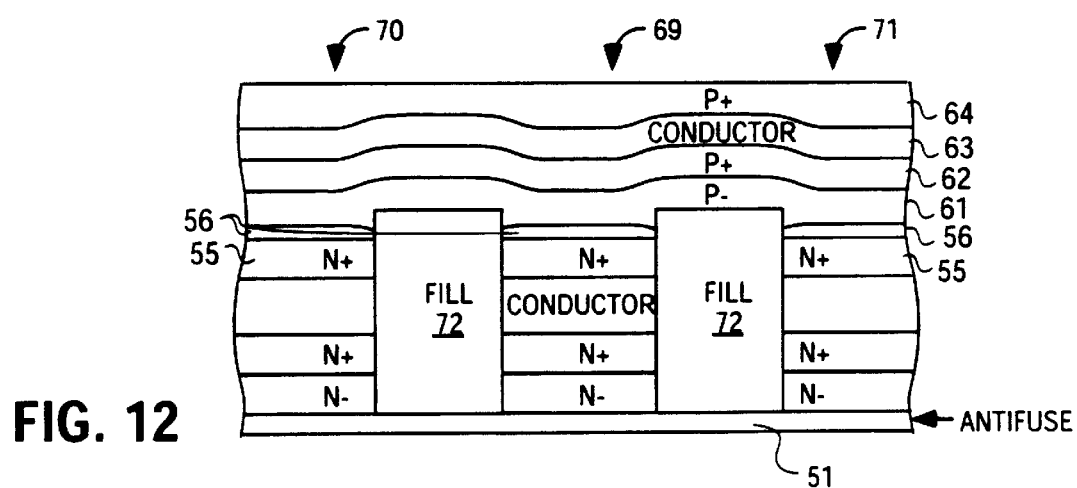
FIG. 12 illustrates the structure of FIG. 11 after the formation of a second plurality of rail stacks have been formed.

Next, as shown in FIG. 12, the P type silicon films (61, 62, and 64) as well as the conductor 63 are blanket deposited over the structure of FIG. 11 and patterned into a plurality of spaced-apart lines which run transverse of rail stacks 5 (69, 70, and 71) to complete the fabrication of antifuse memory device between Rails 5 and 6. The hard mask process of the present invention can be utilized to pattern the films of rail stacks 6 into a plurality of spaced-apart lines and to fill the gaps between the lines with a dielectric.

Thus, a method of forming a three-dimensional memory devices comprised of orthogonally running rail stacks utilizing a hard mask has been described.

Method of Forming a Pillar Memory with a Hard Mask

Figure 13:
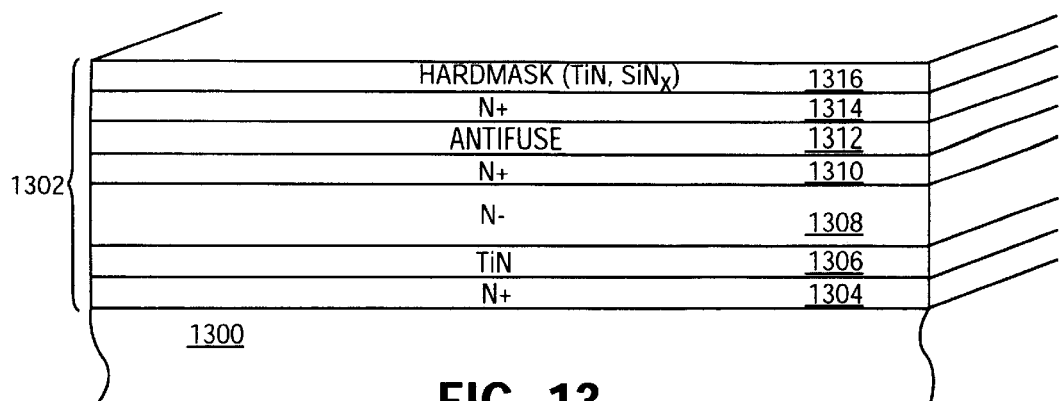
FIG. 13 illustrates a cross-sectional view showing the formation of a stack of films for a pillar memory device and a hard mask layer.

FIGS. 13–21 illustrate a method of forming a pillar memory device utilizing a hard mask in accordance with an embodiment of the present invention. In a method of fabricating a pillar memory device utilizing a hard mask, first the films 1302 used to form the pillar memory device are blanket deposited over a planarized interlayer dielectric 1300 formed above CMOS circuits as shown in FIG. 13. In one method of forming a pillar memory device, each pillar includes a Schottky diode. A Schottky diode can be formed by placing a low doped silicon film, such as an N− silicon film, in direct contact with a metal film such as TiN or titanium silicide. In an embodiment of the present invention, pillar films 1302 include a heavily doped silicon film 1304, such as an N+ silicon film, formed to a thickness between 300–2000 Å. This film is optional. A lower conductive layer 1306, such titanium silicide or titanium nitride, having a thickness between 500–1500 Å is formed on the N+ silicon film 1304. The pillar films 1302 include a low doped silicon film 1308, such as N− silicon film, having a thickness between 500–4000 Å formed on the conductive layer 1306. Forming a low doped silicon film on a metal film, such as titanium nitride, creates a Schottky diode. The Schottky diode formed by the metal layer 1306 and the low doped silicon film 1308 can be said to point "up" because current flows from the metal film 1306 to the N− silicon film 1308. A heavily doped silicon film 1310 having the same conductivity type as the lightly doped silicon film 1308 and having a thickness between 300–2000 Å is formed on the lightly doped silicon film 1308. An antifuse layer 1312, such as an oxide, having a thickness between 25–200 Å, is formed on the heavily doped silicon film 1310. A top or terminal heavily doped silicon film 1314 which is heavily doped and has the same conductivity type and concentration as silicon film 1310 is formed on the antifuse layer.

As will be seen, the present invention utilizes a hard mask process to ensure that there is no erosion of the deposited terminal silicon film 1314 during subsequent planarization, etch, and clean steps. In this way, the terminal silicon film 1312 can be formed to the thickness desired for a functional device without the need for sacrificial silicon which reduces furnace time during the deposition of the silicon films.

After the formation of the terminal silicon film 1314, a hard masking layer 1316 is formed on the terminal silicon film 1314. The hard masking layer 1316 should be a hard material, that is, a material that erodes more slowly during planarization than the dielectric filling material used in subsequent steps. The hard masking layer of the present invention can be a conductive film, such as titanium nitride, or a dielectric film, such as silicon nitride. If the hard mask is a dielectric film, then it will be subsequently removed after polishing. Other hard mask materials include but are not limited to tungsten and tungsten silicide. If the hard mask material is a conductive film, such as titanium nitride, it can be left on, if desired, to make a low resistance ohmic contact to the N+ silicon film 1314 of the pillar memory device. As will be seen, the hard masking layer 1316 after patterning, acts as a polish stop for a planarization step. The masking layer 1316 will preferably have a selectivity of greater than 4:1 with respect to the subsequently deposited fill dielectric during the subsequent polishing of the fill dielectric. Additionally, if a silicon nitride hard masking layer 1316 is used, typically a thin oxide layer is formed on the silicon layer 1314 prior to forming the nitride layer in order to protect the underlying silicon. For instance, at 25–200 Å of grown or deposited silicon oxide may be formed.

Figure 14:
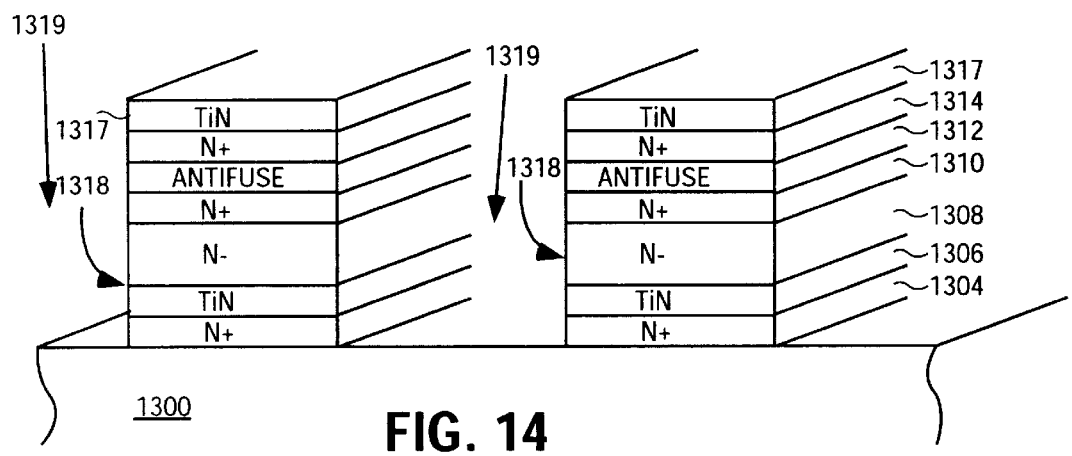
FIG. 14 illustrates the FIG. 13 after the masking layer and pillar layers have been patterned.

Next, as shown in FIG. 14, the hard masking layer 1316 is patterned using ordinary photolithography and etching steps to form a hard mask 1317 as shown in FIG. 14. Mask 1317 defines locations where a plurality of spaced-apart lines are to be formed from the pillar films 1302. Additionally, as also shown in FIG. 14, the pillar films are etched in alignment with mask 1317 forming a plurality of spaced-apart lines 1318. Spaces 1319 result between the lines as shown in FIG. 14. Silicon/antifuse/conductor stacks can be etched with a plasma etch comprising some or all of the following gases: HBr and $Cl_2$. The use of a hard mask 1317 during etching of the films to form a plurality of lines enables the lines to be formed with better critical dimension (CD) control than if a hard mask 1317 was not used. Additionally, because no sacrificial silicon is necessary, the etch time is substantially reduced.

Figure 15:
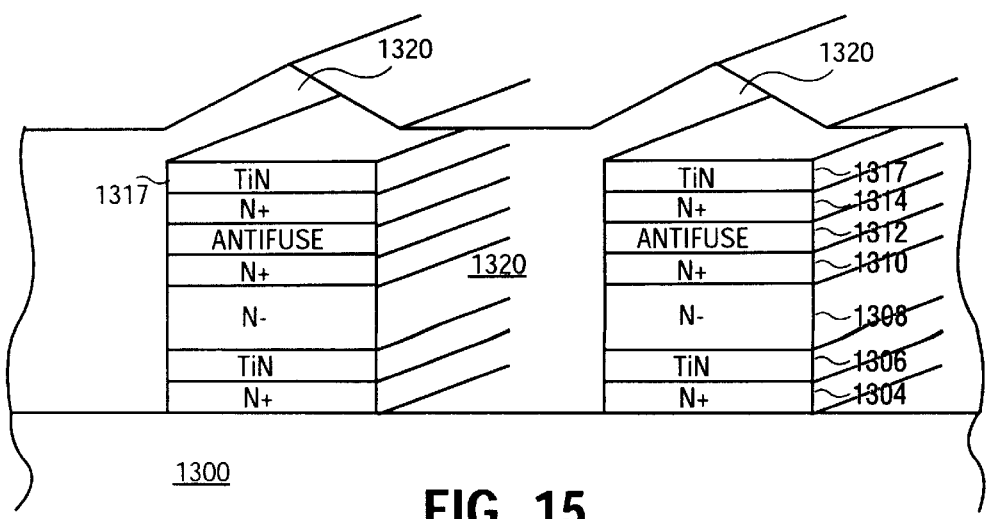
FIG. 15 illustrates the structure of FIG. 14 after a dielectric filling material is formed.

Next, as shown in FIG. 15, the spaces 1319 between the lines 1318 are filled with a dielectric material 1320, such as a CVD formed silicon dioxide or other dielectric material. This material 1320 is chosen to be softer than the masking layer 1316 as mentioned above. An important example is in the use of a CMP slurry that is selective to silicon dioxide over silicon nitride or titanium nitride. That is, the erosion rate of silicon oxide is much greater than that of silicon nitride or titanium nitride using such a slurry. As shown in FIG. 15, the dielectric fill material is deposited to a thickness which is sufficient to completely fill the spaces or gaps 1319 between adjacent lines. It is to be appreciated that during deposition fill 1320 accumulates on the tops of the masking members 1317 as a result of filling the dielectric material between the lines 1318. It is to be appreciated that the deposition time and amount of dielectric necessary to fill the gaps 1319 is reduced because no sacrificial silicon is necessary.

Figure 16:
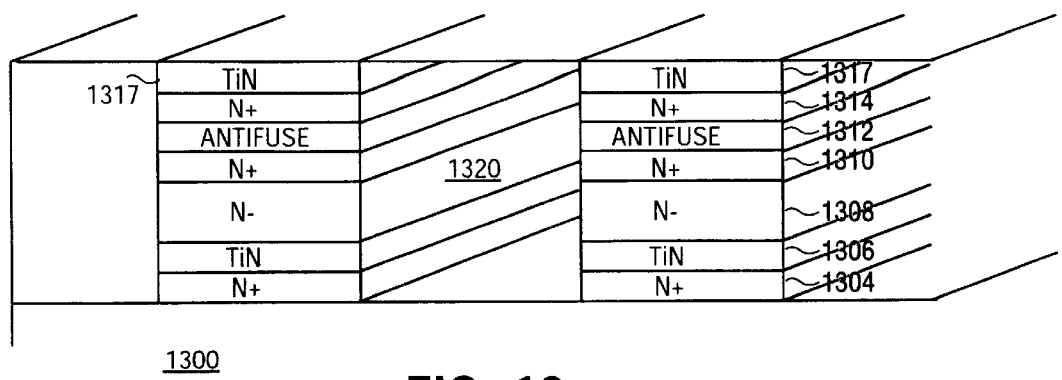
FIG. 16 illustrates the structure of FIG. 15 after a planarization step.

Next, a planarization step which removes the dielectric material 1320 from the upper surfaces of the hard mask 1317 as shown in FIG. 16 is used. While chemical planarization may be used, in one embodiment of the present invention, chemical mechanical polishing (CMP) is preferred. The etchants used in such a planarization are selected from commercial available etchants, such that the dielectric material is eroded without significantly etching of the hard mask 1317. In effect, the mask acts as an erosion stop for the resultant structure as shown in FIG. 16. In an embodiment of the present invention, the oxide dielectric 1320 is chemically mechanically polished from the hard mask utilizing a slurry that erodes the silicon dioxide dielectric at a much faster rate than the hard mask, such as a silicia or ceria ($CeO_2$) slurry. After polishing, a post CMP clean, typically an $NH_4OH$ based scrub, can be used to clean the structure. Additionally, as described above, the hard mask protects the underlying silicon enabling over polishing to be used to ensure complete removal of the dielectric fill from large features.

At this time, if desired, the hard mask 1317 can be removed. For example, if the hard mask layer is a dielectric, such as silicon nitride, then it (and the buffer oxide) must be removed so that a subsequently formed conductive layer can make direct contact to the N+ silicon film 1314 and form a low resistance ohmic contact. If however, the hard mask is a conductive metal film, such as titanium nitride, then the hard mask can remain because the metal hard mask 1317 forms a low resistance ohmic contact with the underlying N+ silicon film 1314.

Figure 17:
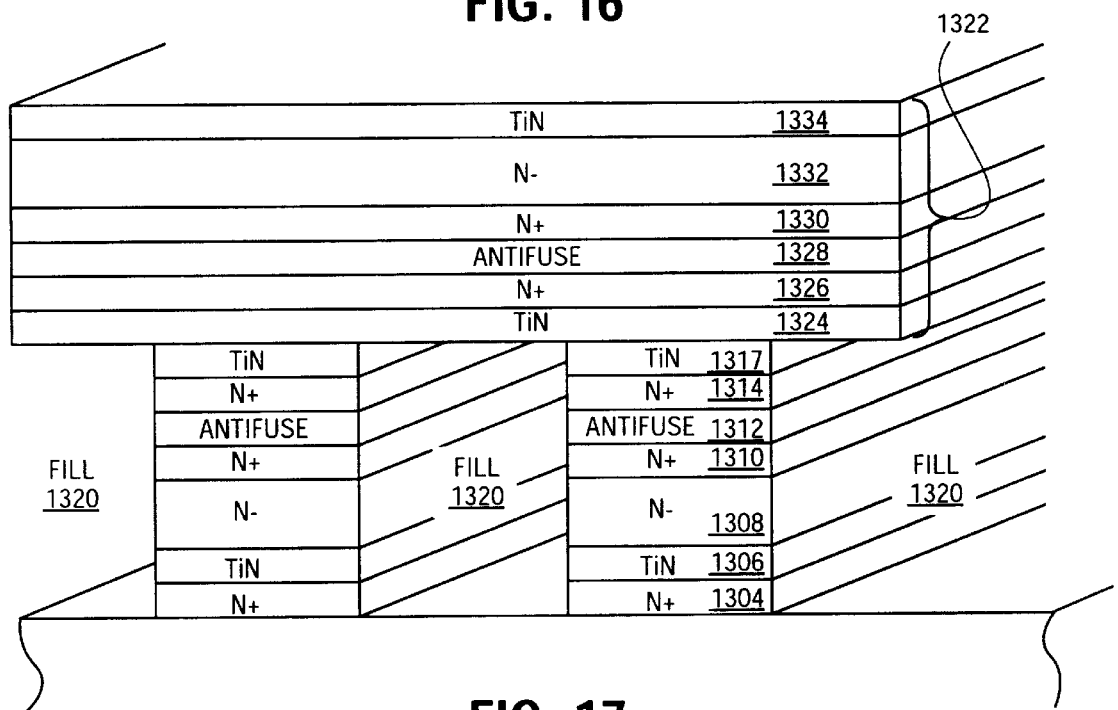
FIG. 17 illustrates the structure of FIG. 16 after a second hard masking layer and a second plurality of films have been formed for a second level of pillars.

Next, as shown in FIG. 17, the films 1322 for the next level of pillar memory devices are blanket deposited over the structure of FIG. 16. In an embodiment of the present invention films 1322 will include a lower conductive 1324, such as titanium nitride (TiN). If a metal hard mask 1317 is utilized, then the conductive layer 1324 is formed on and in direct contact with hard mask 1317 as well as on planarized fill dielectric 1320 as shown in FIG. 17. The conductive film 1324 makes an ohmic contact with metal hard mask 1317. If however, the hard mask is removed, the conductive film 1324 forms directly onto the N+ silicon film 1314 of lines 1318 to form an ohmic contact. The metal 1324 also forms onto the planarized fill dielectric 1320.

Next, an N+ silicon film 1326 is formed on the metal conductor 1324. Formed on the top of the N+ silicon film 1326 is an antifuse layer 1328 such as an oxide having a thickness between 25–200 Å. Formed on the antifuse layer 1328 is a second N+ silicon film 1330. Formed on the N+silicon film 1330 is a top or terminal N− silicon film 1332.

Because the thickness of the N− silicon film 1332 determines or sets the electrical properties and performance of the Schottky diode of the fabricated pillar devices, it is important to ensure that the thickness of the N− silicon film 1332 is uniform across a wafer as well as uniformly formed in each of the subsequently formed pillar devices above. As such, the present invention utilizes a hard mask process to ensure that there is no erosion of the deposited terminal N− silicon film 1332 during subsequent planarization, etching, and clean steps. In this way, no sacrificial silicon is necessary and furnace time reduced during the deposition of the silicon films.

Figure 18:
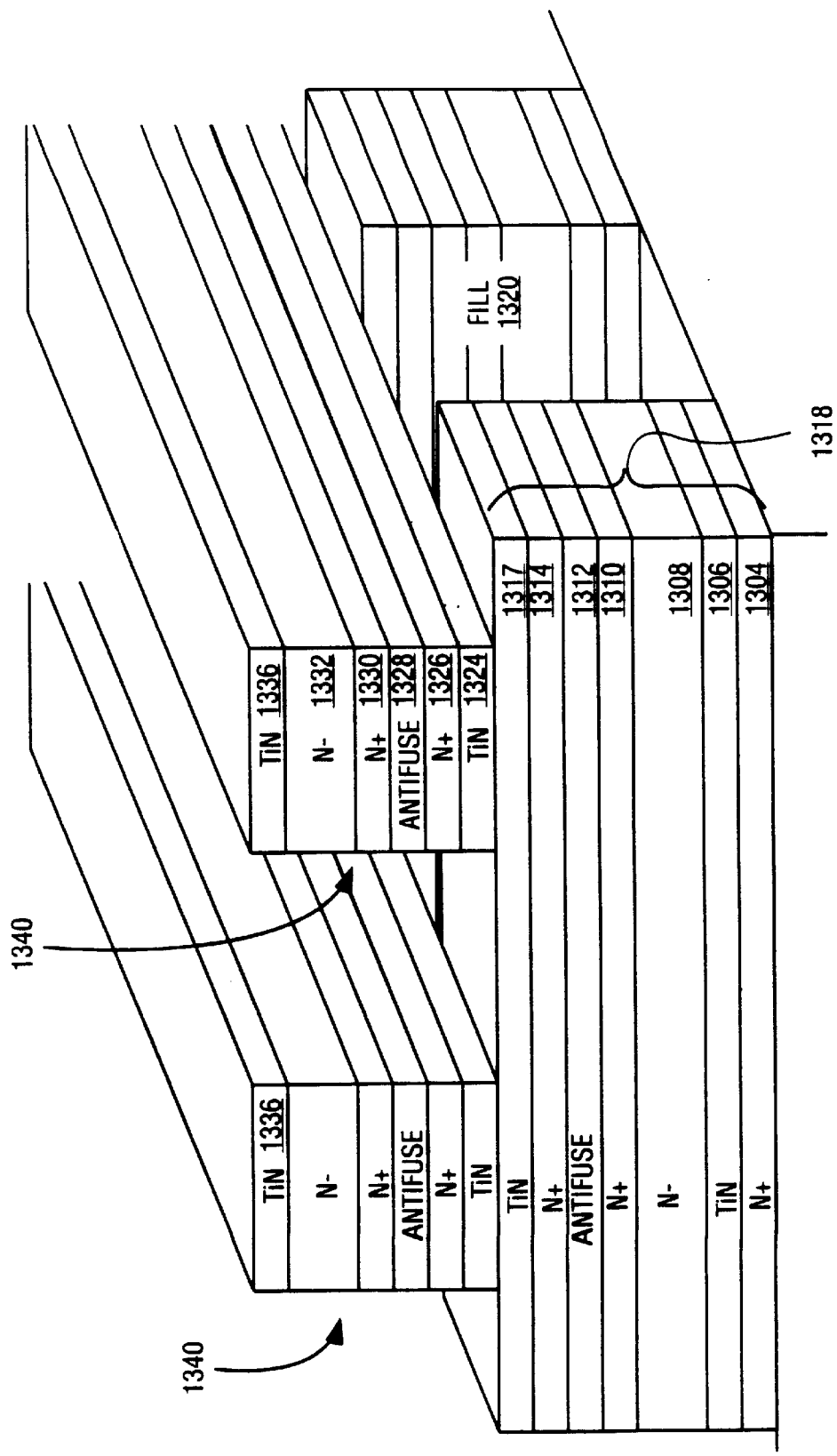
FIG. 18 illustrates the structure of FIG. 17 after the patterning of the second stack of films.

Formed on the terminal silicon film 1332 is a second hard mask layer 1334. Hard mask layer 1334 can be formed of film and in a manner as described with respect to hard mask layer 1316. Again, the hard mask layer can be a dielectric or a metal. If the hard masking layer is a metal, it makes a Schottky diode with N− silicon film 1332. The Schottky diode can be said to point "down" because current flows from the metal layer 1334 to the N− silicon layer 1322. Next, the hard mask layer 1334 is patterned using ordinary photolithography and etching techniques to form mask 1336 as shown in FIG. 18. (It is to be appreciated that FIG. 18 shows a cross-section of the substrate of FIG. 17 rotated 90° and taken through one of the lines 1318.) Mask 1336 defines the locations where a plurality of spaced-apart lines are to be formed from films 1322. Additionally, as also shown in FIG. 18, the films 1322 are etched in alignment with mask 1336 forming a plurality of spaced-apart lines 1340. It is to be appreciated that lines 1340 run in a direction perpendicular or orthogonal to lines 1318.

Figure 19:
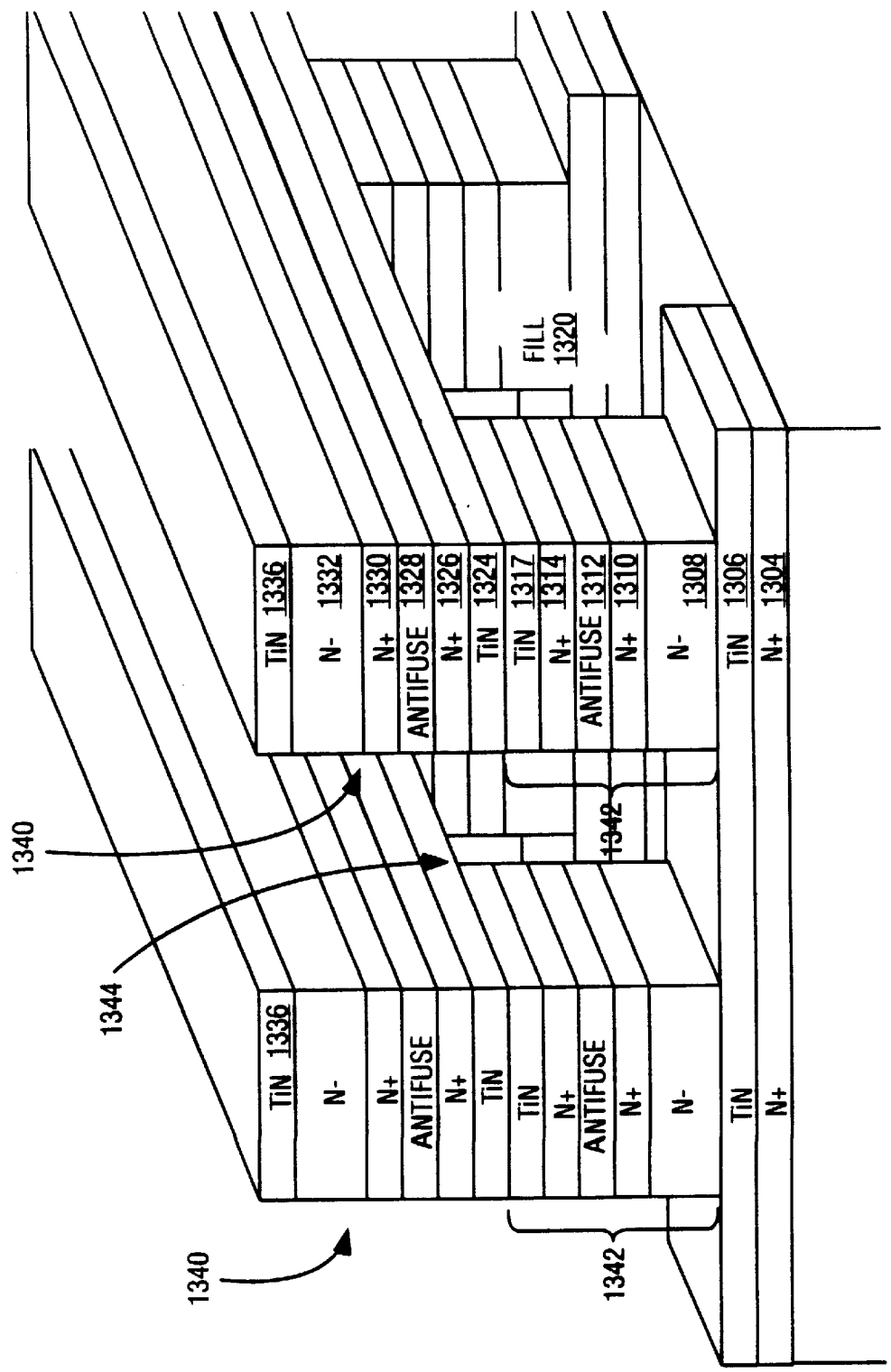
FIG. 19 illustrates the structure of FIG. 18 after the formation of a first plurality of pillars from the first plurality of patterned lines.

Next, as shown in FIG. 19, the etch used to form the plurality of spaced-apart lines 1340 from films 1322 is continued in alignment with hard mask 1336 and into lines 1318 to form a plurality of pillars 1342 from lines 1318. The etch forms a gap 1344 between pillars 1342 and lines 1340. The etch stops on conductive film 1306, as shown in FIG. 19. By stopping on the conductive film 1306, adjacent pillars 1342 in a row are electrically coupled together to form a bit line (or a word line). A pillar memory is therefore formed between the intersections or projections of the orthogonally positioned conductive lines 1306 and 1324.

Figure 20:
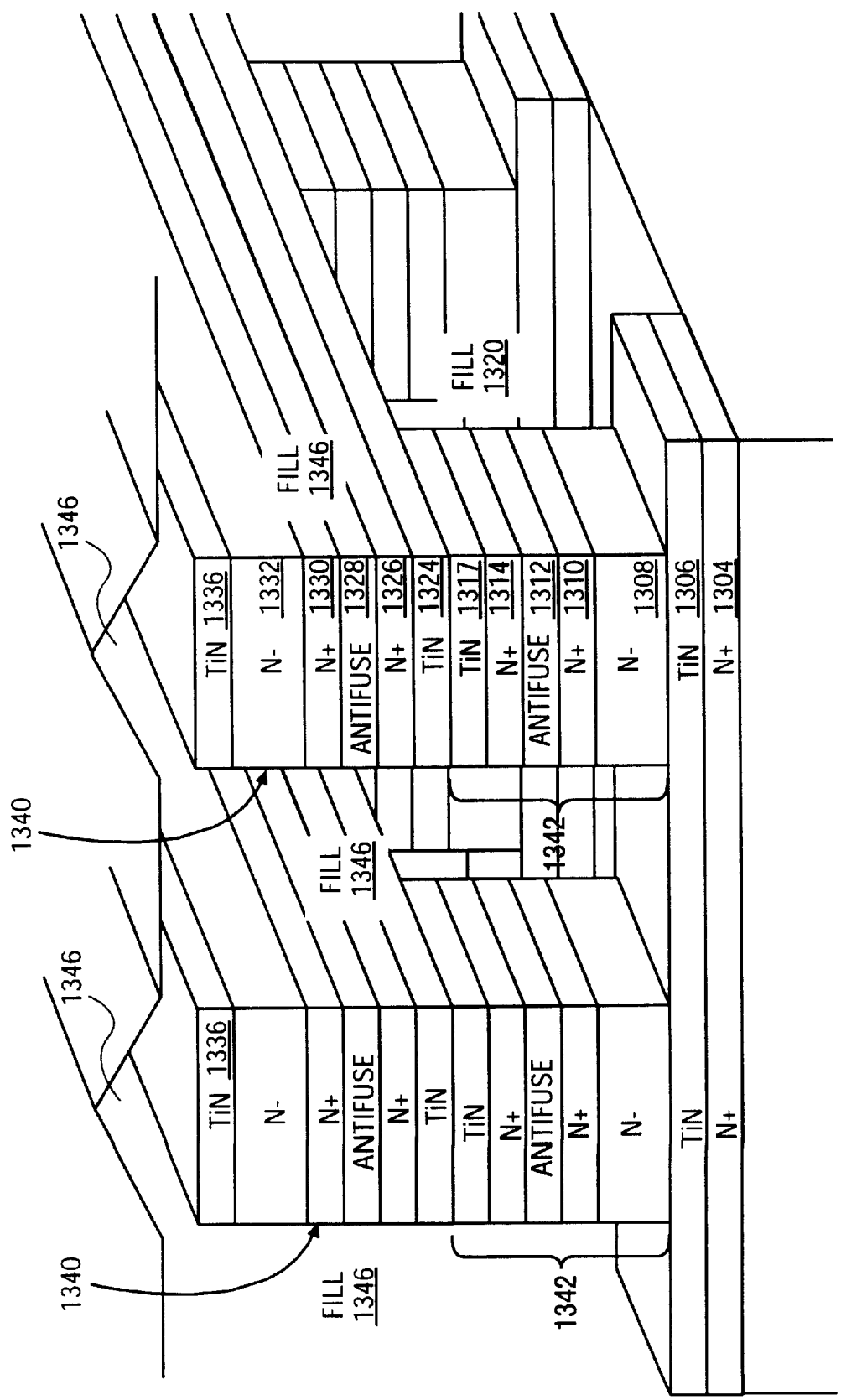
FIG. 20 illustrates the structure of FIG. 19 after the deposition of a second fill dielectric.
Figure 21:
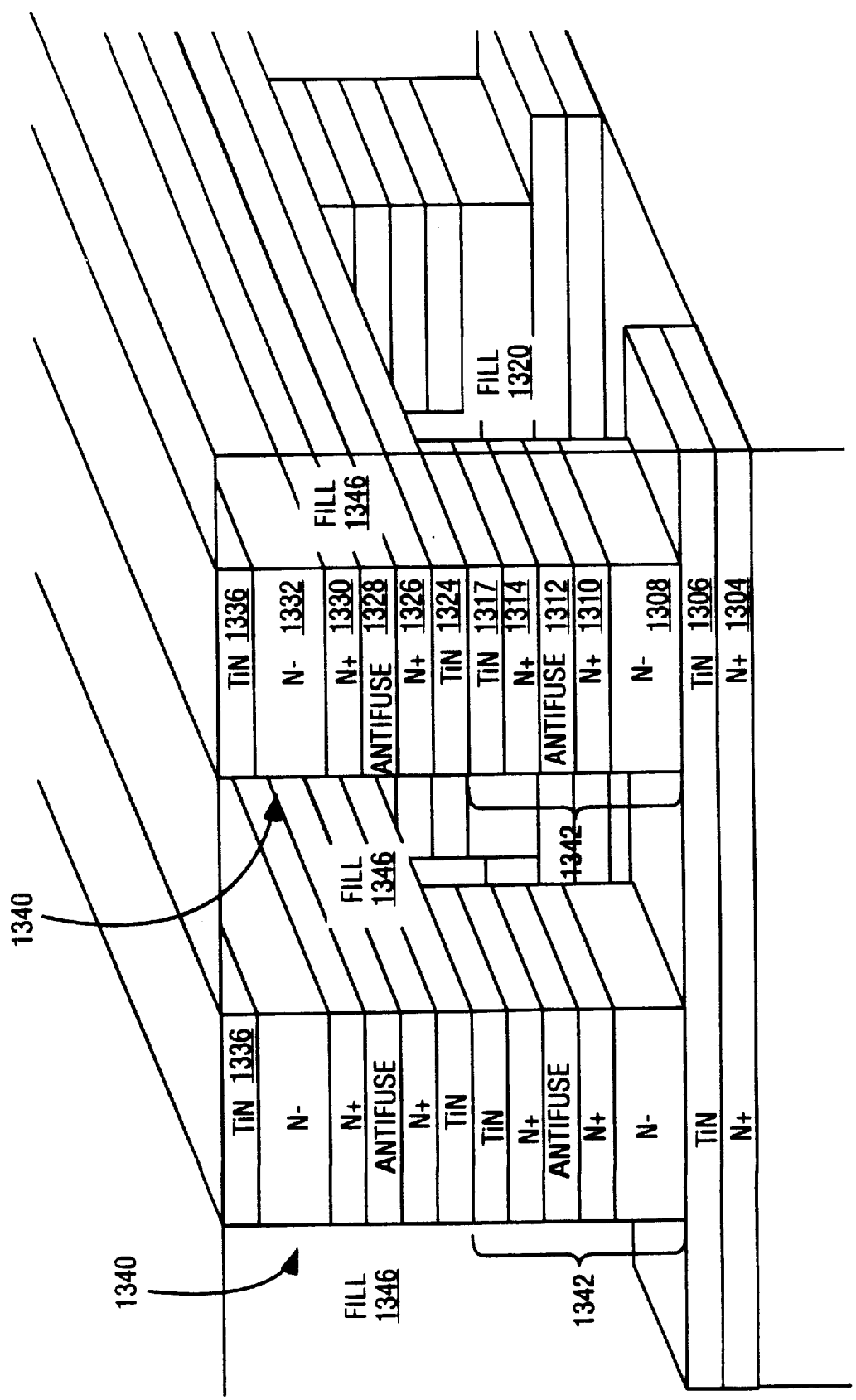
FIG. 21 illustrates the structure of FIG. 20 after the planarization of the second fill dielectric.

Next, as shown in FIG. 20, a second fill dielectric is deposited over the structure of FIG. 19 and fills gaps 1344 between lines 1340 and pillars 1342. The dielectric fill material is formed of a material, such as a CVD deposited oxide, which is softer than the hard mask material 1334. Next, the structure of FIG. 20 is planarized with for example, chemical mechanical polishing utilizing a polishing process and slurry which erode the second dielectric fill 1346 faster than the hard mask 1336. The hard mask 1336 provides a polish stop for the second dielectric fill planarization step. As such, the hard mask protects the underlying silicon from erosion during the polishing process. Additionally, the hard mask 1336 provides a mask for the long etch required to form lines 1340 and pillars 1342. The use of a hard mask 1336 helps improve the critical dimension control of the etch. Like hard mask 1316, hard mask 1336 can now be removed, if desired. If hard mask 1336 is a metal hard mask it can remain because it makes a Schottky diode with N− silicon film 1332. It is to be appreciated that the N− silicon film 1332 determines the electrical performance of the formed Schottky diode of the pillar device. By using a metal hard mask 1336 to protect the underlying silicon from subsequent process steps, the surface of the silicon film remains pristine and thickness remains the same as from deposition, thereby improving the reliability, uniformity and performance of the device. If the hard mask is removed, the subsequently deposited films for the next level of pillar memories will include a lower metal layer which directly contacts the N− silicon film 1332 to form a Schottky diode.

The process steps as described above are continued in a similar manner to form a plurality of pillars from lines 1340 and to form pillar memories in higher levels.

It is to be appreciated that the formation of pillar memory with a hard mask has been described with respect to specific film stacks. It is to be appreciated that other film stacks can be used without departing from the scope of the present invention. For example, the described pillar film stacks can include a titanium silicide (TiSi$_x$) film below or above each TiN film for enhanced conductivity of the interconnect and/or make TiSi$_2$/N− Schottky diodes instead of TiN/N− Schottky diodes. Thus, a method of forming a pillar memory array utilizing a hard mask has been described.

Although the present invention has been described with respect to the formation of memory arrays from orthogonally running rail stacks or from pillar memory devices, the present invention is equally useful in the fabrication of other types of memory devices. The present invention is especially useful in cases where features having a top or terminal silicon film are patterned or require polishing.

The advantages of the described hard mask embodiments of the present invention include:

The possibility of depositing significantly less sacrificial silicon as the terminal array material, decreasing device cost due to the need for less furnace time. This also enables the ability to precisely control the top silicon film thickness as this can be important to device performance.

Due to decreased stack heights as a result of the need for less sacrificial silicon, less etch time is needed to pattern the arrays, and less fill oxide deposition time is needed to fill the spaces. This decreases device costs by potentially reducing fab capital expenditure as well as increasing tool uptime.

Increased ease in addressing depth-of-focus issues, since the narrow array features can tolerate longer overpolishing without eroding the active line material. Therefore wider features such as landing pads and scribe line structures can be cleared, avoiding the excessive topography that causes depth-of-focus problems.

The ability to exploit the body of knowledge in place for STI CMP, for example post-CMP cleans.

We claim:

1. A method of fabricating a device comprising:
    forming a semiconductor layer having an upper surface;
    forming a masking layer over said semiconductor layer;
    patterning the masking layer;
    etching at least the semiconductor layer in alignment with the patterned masking layer to define array features, the features having an upper surface;
    filling between the features with a dielectric material which is softer than the masking layer; and
    planarizing the dielectric material with the masking layer acting as the stop.

2. A method for fabricating a three-dimensional array comprising:
    forming a silicon layer having an upper surface;
    forming a masking layer over the silicon layer;
    patterning the masking layer;
    etching at least the silicon layer in alignment with the patterned masking layer to define memory array features, the features having an upper surface;
    filling between the features with a dielectric material which is softer than the masking layer;
    planarizing the dielectric material with the masking layer acting as a stop;
    removing the patterned masking layer; and
    forming an antifuse layer on the upper surface of the features.

3. The method defined by claim 2 wherein the antifuse layer is formed by a blanket deposition covering the features and the dielectric material.

4. The method defined by claim 2 wherein the antifuse layer is silicon dioxide.

5. The method defined by claim 2 wherein the silicon layer is formed by an annealing an amorphous silicon layer.

6. The method defined by claim 4 wherein the silicon dioxide is deposited by chemical-vapor-deposition (CVD).

7. The method defined by claim 2 wherein the antifuse layer is grown from the silicon layer.

8. The method defined by claim 7 wherein the grown silicon dioxide layer is grown in a steam atmosphere.

9. The method defined by claim 2 wherein the masking layer comprises silicon nitride.

10. The method defined by claim 9 wherein the dielectric material is silicon dioxide.

11. The method defined by claim 10 wherein the planarization comprises chemical-mechanical polishing.

12. The method defined by claim 11 wherein the silicon layer is a polysilicon layer.

13. The method defined by claim 11 wherein the polysilicon layer is a doped layer.

14. A method for fabricating a three-dimensional memory array comprising:
    forming a polysilicon layer;
    forming a masking layer comprising silicon nitride over the polysilicon layer on an upper surface of the polysilicon layer;
    patterning the masking layer;
    etching at least the polysilicon layer in alignment with the patterned masking layer to define parallel, spaced-apart memory lines;
    filling spaces between the memory lines with a dielectric material which planarizes more readily than silicon nitride;
    planarizing the dielectric material with the silicon nitride layer acting as an etchant stop;
    removing the silicon nitride layer;
    forming a silicon dioxide layer over the polysilicon lines.

15. The method defined by claim 14 wherein the forming of the polysilicon comprises annealing an amorphous silicon layer.

16. The method defined by claim 14 wherein the silicon dioxide layer is a grown layer grown from the polysilicon lines.

17. The method defined by claim 16 wherein the silicon dioxide layer is grown in a steam atmosphere.

18. The method defined by claim 14 wherein the silicon dioxide layer is a deposited layer.

19. The method defined by claim 14 wherein the polysilicon lines are doped with a first conductivity-type dopant.

20. The method defined by claim 19 wherein another layer of polysilicon doped with a second conductivity type dopant is deposited over the silicon dioxide layer.

21. The method of claim 14 further comprising the step of forming a thin oxide on the polysilicon lines prior to forming said silicon nitride layer.

22. A method of forming a nonvolatile memory array comprising:
    forming a first stack of films having a top silicon film of a first conductivity type;
    forming a masking layer on said top silicon film of said first stack of films;
    patterning said masking layer to form a patterned masking layer;
    etching said first stack of films in alignment with said patterned masking layer to form a plurality of spaced-apart lines from said first stack of films;
    depositing a dielectric material between said plurality of spaced-apart lines and on said patterned masking layer;
    planarizing said dielectric material with a chemical mechanical polishing process utilizing said masking layer as a polish stop;
    removing said patterned masking layer from said plurality of spaced-apart lines;
    forming an antifuse on said top silicon film of said plurality of spaced-apart lines; and
    forming a second stack of films having a lower silicon film of a second conductivity type opposite said first conductivity type on said antifuse on said top silicon film of said first plurality of rail stacks.

23. A method of forming a memory comprising:
    forming a first stack of films having a top silicon film;
    forming a hard mask layer on said silicon top film;
    patterning said hard mask layer into a patterned hard mask having a plurality of spaced-apart lines;
    etching said first stack of films in alignment with said patterned hard mask to form a plurality of spaced-apart lines from said first stack of films;
    depositing a dielectric between said plurality of spaced-apart lines of said first film stack and onto said hard mask;

planarizing said dielectric utilizing said hard mask as a planarization stop;

removing said hard mask;

depositing a conductive film over said top silicon film of said plurality of spaced-apart lines and over said planarized dielectric;

patterning said conductive film into a plurality of conductive lines which run orthogonal to said first plurality of lines formed in said first stack of films; and etching said plurality of spaced-apart lines of said first stack of films in alignment with said conductive lines to form a plurality of pillars from said plurality of spaced-apart first stack of films.

24. A method of forming a memory comprising:

forming a first stack of films having a top silicon film;

forming a conductive hard mask layer on said silicon top film;

patterning said conductive hard mask into a patterned conductive hard mask having a plurality of spaced-apart lines;

etching said first stack of films in alignment with said patterned conductive hard mask to form a plurality of spaced-apart lines from said first stack of film;

depositing a dielectric between said plurality of spaced-apart lines of said first film stack and onto said conductive hard mask;

planarizing said dielectric utilizing said conductive hard mask as a planarization stop;

depositing a conductive film over and in direct contact with said patterned conductive hard mask on said plurality of spaced-apart lines;

patterning said conductive film into a plurality of conductive lines with run orthogonal to said first plurality of lines formed in said first stack of films; and etching said plurality of spaced-apart lines of said first stack of films in alignment with said conductive lines to form a plurality of pillars from said plurality of spaced-apart lines of said first stack of films.

* * * * *